(12) United States Patent
Linam et al.

(10) Patent No.: US 7,640,468 B2
(45) Date of Patent: Dec. 29, 2009

(54) METHOD AND APPARATUS FOR AN EMBEDDED TIME DOMAIN REFLECTOMETRY TEST

(75) Inventors: David L. Linam, Fort Collins, CO (US); Jeffrey R. Rearick, Fort Collins, CO (US); Guy Harlan Humphrey, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 339 days.

(21) Appl. No.: 10/996,113

(22) Filed: Nov. 23, 2004

(65) Prior Publication Data
US 2006/0123305 A1 Jun. 8, 2006

(51) Int. Cl.
*G01R 31/28* (2006.01)
(52) U.S. Cl. .................................................... 714/724
(58) Field of Classification Search ................. 714/724, 714/744
See application file for complete search history.

(56) References Cited
U.S. PATENT DOCUMENTS

| | | | |
|---|---|---|---|
| 5,396,170 A * | 3/1995 | D'Souza et al. .......... 324/158.1 |
| 6,184,708 B1 * | 2/2001 | Jenkins, IV .................. 326/39 |
| 6,266,793 B1 * | 7/2001 | Mozdzen et al. ............ 714/727 |
| 6,397,361 B1 * | 5/2002 | Saitoh ........................ 714/724 |
| 6,477,674 B1 * | 11/2002 | Bates et al. .................. 714/738 |
| 6,617,869 B1 | 9/2003 | Pillkahn |
| 6,812,727 B2 * | 11/2004 | Kobayashi ................... 324/765 |
| 2002/0089335 A1 | 7/2002 | Williams |
| 2002/0095633 A1 | 7/2002 | Pillkahn |
| 2003/0163272 A1 | 8/2003 | Kaburlasos |
| 2003/0208734 A1 | 11/2003 | Coelho, Jr. et al. |
| 2004/0049721 A1 | 3/2004 | Laake et al. |
| 2004/0153276 A1 | 8/2004 | Combs et al. |

FOREIGN PATENT DOCUMENTS

EP 0576921 6/1993

* cited by examiner

Primary Examiner—James C Kerveros (57) ABSTRACT

A method and apparatus for testing an integrated circuit interconnect comprises an IC having circuitry embedded in the IC capable of providing a pseudo time domain reflectometry test by launching a test transition onto the interconnect and capturing a reflection of the test transition.

23 Claims, 7 Drawing Sheets

METHOD AND APPARATUS FOR AN EMBEDDED TIME DOMAIN REFLECTOMETRY TEST

BACKGROUND

When a printed circuit board ("PCB") fails, it can be for any number of reasons. Identifying the reason presents significant challenges. The challenge increases with increase in PCB size and complexity. In some cases, an IC fails. In other cases, one or more interconnects between ICs cause the failure. There are a number of conventional methods for testing ICs on a PCB. The IC test methods range from in-circuit testing on dedicated equipment to functional testing and testing using JTAG protocols found in the IEEE Std 1149.1 specification. In addition, some ICs include an embedded self-test that provides an indication of whether a particular IC is operational or not. These tests, however, identify only a subset of all potential faults that cause PCB failure.

In order to identify failures on interconnects between ICs or potential interconnect impedance issues, it is conventional to remove the PCB from the system and then further remove one or more ICs from the PCB in order to perform the test. This process is time consuming, costly, and potentially destructive. There is a need, therefore, to identify a fault on a PCB interconnect with minimum cost.

BRIEF DESCRIPTION OF THE DRAWINGS

An understanding of the present invention can be gained from the following detailed description of the invention, taken in conjunction with the accompanying drawings of which.

DETAILED DESCRIPTION

A method and apparatus for performing an embedded test in an IC for testing, external connections to the IC is disclosed. It is considered an "embedded test" because circuitry to carry out the test is located on the IC itself. The embedded test of the present teachings borrows from time domain reflectometry (herein "TDR") measurement technology and is capable of testing elements external to the IC. Logic circuitry for implementing a pseudo TDR test is embedded in one or more I/O pads of an IC, or embedded in circuitry coupled to one or more I/O pads of an IC. The logic circuitry comprises some new logic and interconnections and also advantageously utilizes circuitry already available as part of a conventional I/O pad to minimize additional cost and size added as a result of the embedded test. The logic circuitry that is added as part of the embedded test function is not related to the actual function of the IC, but is incorporated in the IC for the specific purpose of testing elements external to the IC.

Figure 1:
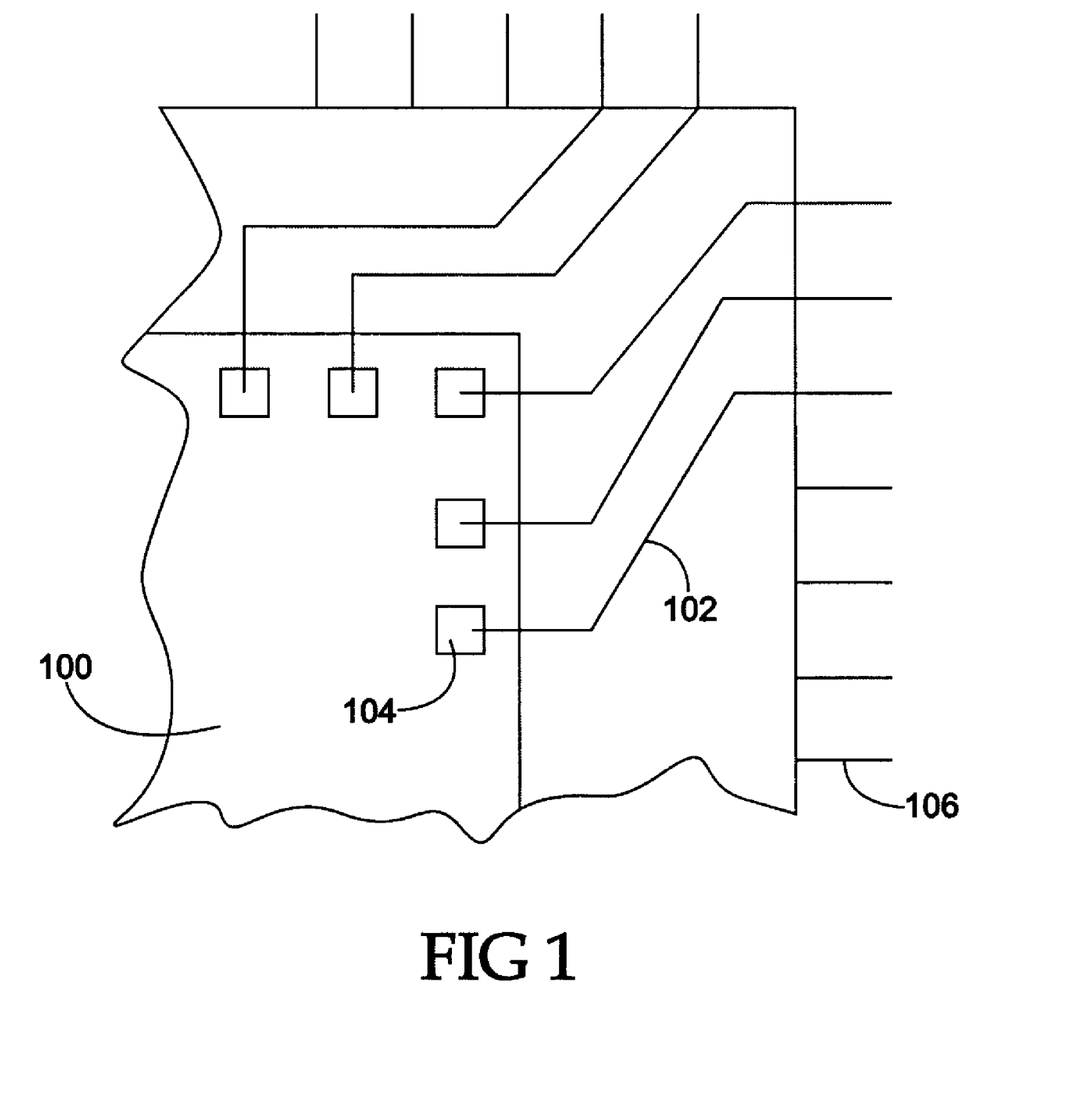
FIG. 1 is a cartoon representation of an integrated circuit including an embodiment of the present teachings.

With specific reference to FIG. 1 of the drawings, there is shown a cartoon representation of a corner portion of a packaged IC 100. As is conventional, the packaged IC 100 has package interconnects 102 between logic on the IC chip 104 and IC pins 106. The IC pins 106 may be of any conventional style including without limitation gull wing leads, ball grid array leads, or flip chip style leads. For purposes of the present teachings, the logic on the IC 104 comprises a specific type of logic that comprises the input and output functions of the IC 100. Circuitry in the IC 100 that supports input and output functions is referred to herein as an I/O pad 104. Note that this circuitry may consist of either analog or digital elements or both, and that it may be physically located near the contact site or be distributed in other areas of the IC.

The embedded TDR test involves driving a transition or pulse of known impedance, amplitude and duration into one end of a transmission element. The transmission element when attached to an IC typically includes a transmission line in the form of a PCB trace with or without a termination. A transition or pulse of known impedance, amplitude and duration is launched onto the transmission element and a reflected signal is measured. Analysis of characteristics of the reflected signal when compared to known characteristics of the transmitted signal can yield information such as transmission line impedance, electrical length of the transmission line, presence, location, and characteristics of transmission line defects, and termination impedance.

Figure 2:
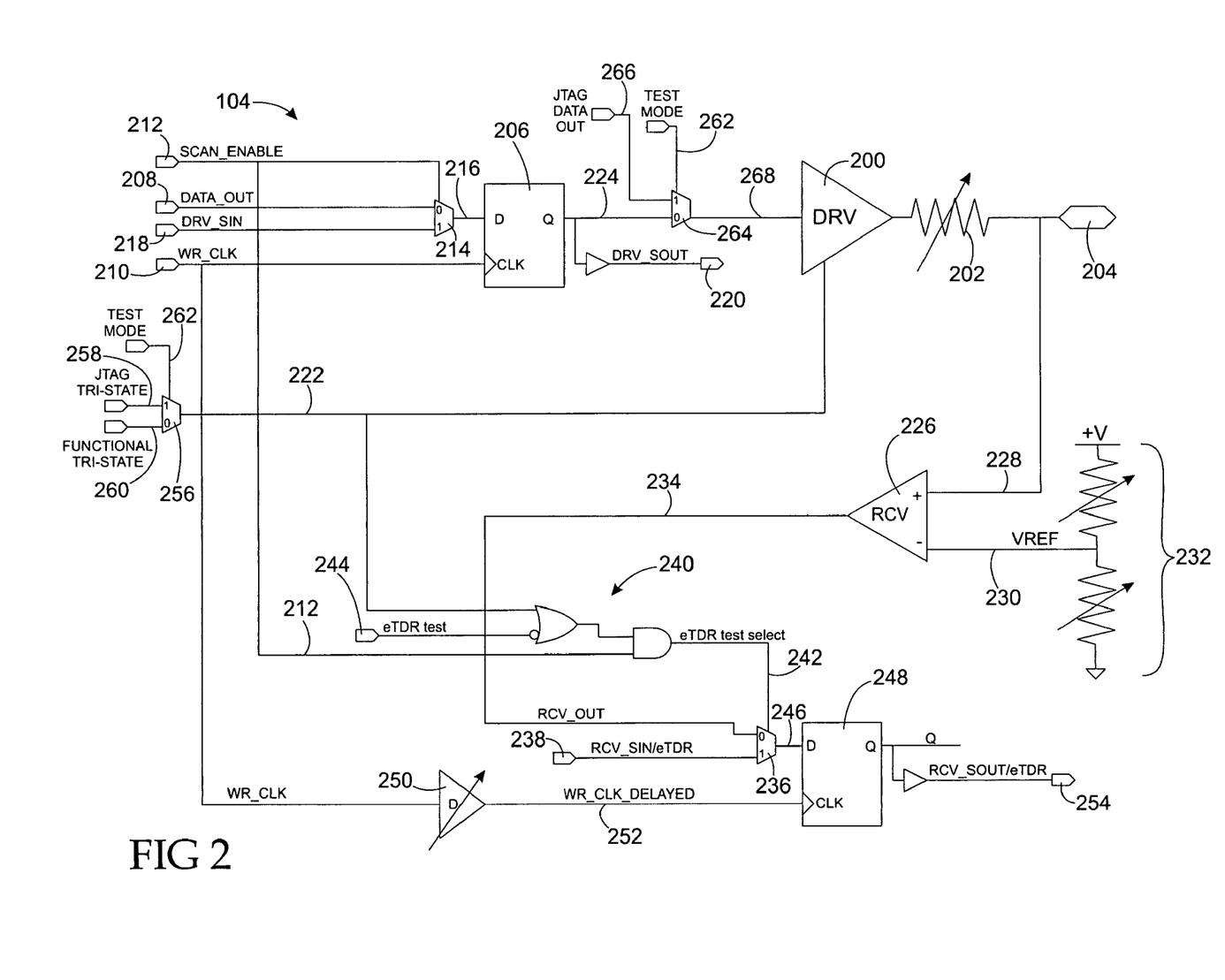
FIG. 2 is a schematic of an embodiment of an IC input/output ("I/O") pad according to the present teachings.

With specific reference to FIG. 2 of the drawings, there is shown a logic diagram of a single I/O pad 104 according to the present teachings in which a data output driver 200 has a programmable output impedance 202 connected to an external connection pad 204. There are typically multiple I/O pads 104 on a single IC and the logic diagram of FIG. 2 illustrates logic present on each I/O pad 104. The data output driver is able to drive a transition or pulse of known output impedance. In a specific embodiment, a conventional process, voltage, and temperature (PVT) compensated driver is acceptable. The data output driver 200 is controlled by a tri-state enable signal 222 to either disable the data output driver 200 by placing it in a high impedance state or to enable the data output driver to present a logic value at its input 224 at the external connection pad 204 through the programmable output impedance 202. In one embodiment according to the present teachings, the tri-state enable signal 222 is sourced from a JTAG tri-state enable register (not shown). The JTAG tri-state enable register is scannable in that it can be loaded with user-defined data in preparation for the TDR test. In an alternate embodiment according to the present teachings, the tri-state enable signal 222 is an output of a two to one tri-state mux 256. Inputs to the tri-state mux 256 include the output of the JTAG tri-state enable register 258 and a functional tri-state signal 260. A test mode signal 262 controls selection of the output of the tri-state mux 256. A data output register 206 receives a data out signal 208 from the IC logic (not shown), which is clocked into the data output register 206 by write/read clock signal 210. In one embodiment, the output of the data output register is presented directly to the data output driver 200 for presentation to the external connection pad 204. In another embodiment as illustrated in FIG. 2 of the drawings, an output of the data output register 224 is one input into a two to one data out mux 264. A second input into the data out mux 264 is a JTAG data out signal 266. Selection of the data out mux 264 is controlled by the test mode signal 262. In this embodiment, the output of the data out mux 264 is presented to the data output driver 200 and external connection pad 204. Accordingly, when the test mode signal is a logic "1", the tri-state mux 256 presents the JTAG tri-state signal at its output 222 and the data out mux 264 presents the JTAG data out signal at its output 268. When the test mode signal is a logic "0", the tri-state mux 256 presents the functional tri-state signal 260 at its output 222 and the data out mux 264 presents the output of the data output register 206 at its output 268. In the embodiment that includes the tri-state mux 256 and the data output mux 264, the driver 200 may be controlled by either the JTAG signals or functional signals as part of the IC logic circuitry. Registers not shown in FIG. 2 are consistent with the IEEE 1449.6 standard that source the JTAG tri-state 258, JTAG data out 266, and test mode 262 signals operate against a separate clock that is asynchronous with the write/read clock 210 and delayed clock 252. A scan enable signal 212 controls a scan enable multiplexer 214 to cause the scan enable multiplexer 214 to select for presentation at the scan enable multiplexer output 216, the data out signal 208 or a scan input signal 218. An output of the data output register 224 is also presented as a scan output signal 220.

The I/O pad also has a comparator type data input receiver 226. A positive input 228 of the data input receiver 226 is connected to the external connection pad 204. A negative input 230 of the data input receiver 226 is connected to voltage reference generator 232. The data input receiver 226 produces a digital signal by comparing the voltage on the external connection pad 204 to a reference voltage. In a preferred embodiment, the data input receiver 226 operates over a wide common-mode range, has minimal propagation delay over the common-mode range, and has minimal offset voltage. The voltage reference generator is programmable for establishing a voltage level at which the data input receiver 226 registers a signal at the external connection pad 204 as a logic "1" or a logic "0". In a preferred embodiment, the programmable voltage reference generator has six or more different voltage settings over the logic "0" to logic "1" range and preferably more. A data input receiver output 234 is provided as an input to a dual input test multiplexer 236 (herein "test mux 236"). A second input to the test mux 236 is a TDR/scan in signal 238. The test mux 236 is controlled by test select 242 at an output of test mux control logic 240. Inputs to the test mux control logic 240 comprise the scan enable signal 212, the JTAG tri-state enable signal 222, and TDR test select 244. The actual logic shown is representational only and is important to the details of an embodiment according to the present teachings in that it provides for the following logic truth table:

TABLE 1

| Test mode | Logic | | | |
|---|---|---|---|---|
| | eTDR test (244) | JTAG tri-state (222) | Scan enable (212) | TDR test select (242) |
| Normal test mode | X | X | 0 | 0 |
| Conventional scan mode | 0 | X | 1 | 1 |
| TDR for I/O pad under test | 1 | 0 | 1 | 0 |
| TDR for I/O pad not under test | 1 | 1 | 1 | 1 |

A test mux output 246 provides input into data capture register 248. A delayed clock 252 clocks the data capture register 248. The delayed clock 252 is the write/read clock 210 delayed in time by delay element 250. In a preferred embodiment, each I/O pad 104 includes a respective programmable delay element 250 between the write/read clock 210 and the clock input to the data capture register 248. In another embodiment, there is a single programmable delay element and output of which feeds a delayed clock tree (not shown) with individual delayed clock signals fed into the I/O pad from the common source. This common delay element embodiment calls for a separate clock tree feeding the data output registers 206 and the data capture registers 248. The delay element 250 is programmable in increments smaller than a single period of the write/read clock 210. An output of the data capture register 248 is presented as a TDR scan out signal 254.

Figure 3:
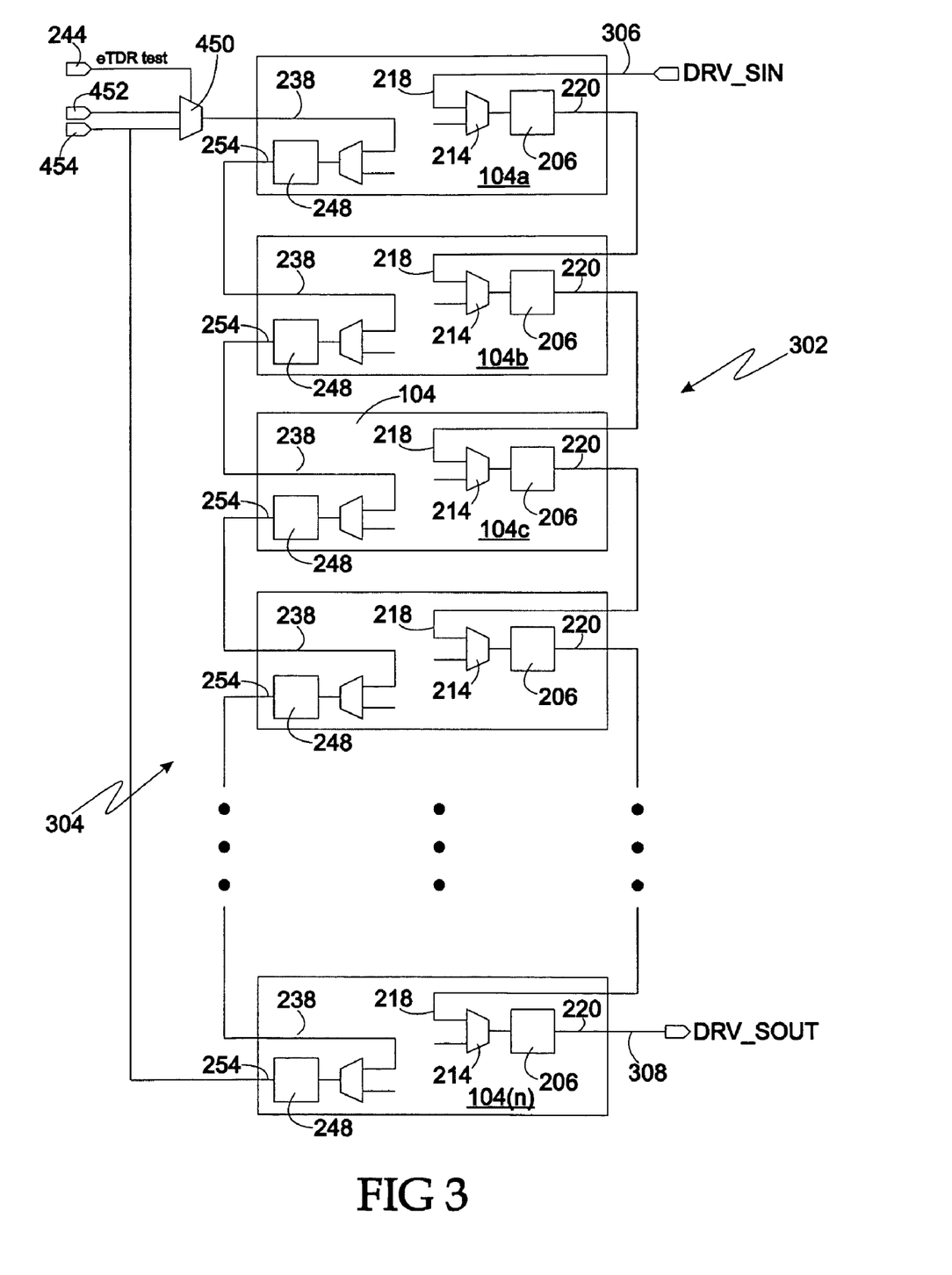
FIGS. 3 and 4 are a representation of an embodiment of the internal connectivity among I/O pad circuits according to the present teachings.
Figure 4:
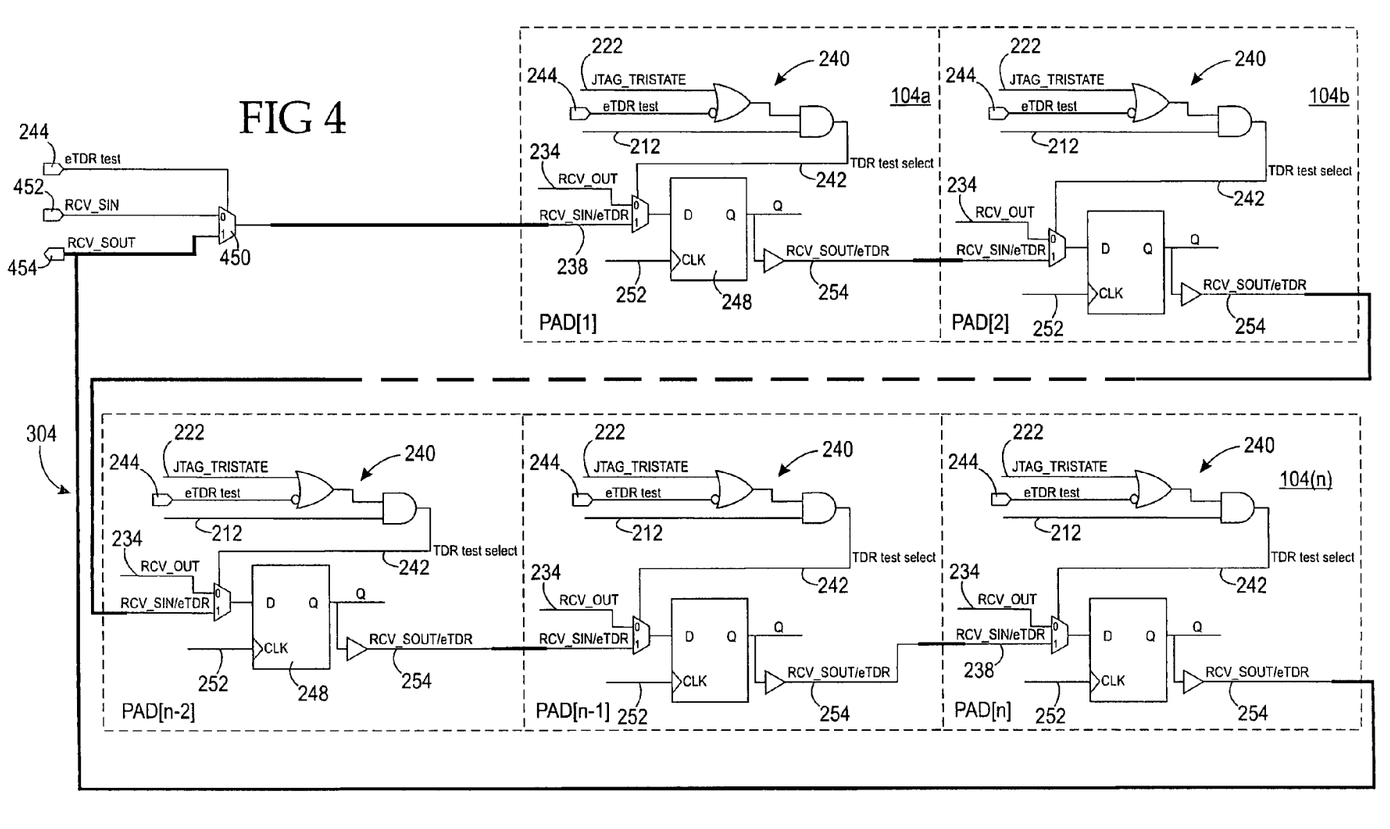

With specific reference to FIGS. 3 and 4 of the drawings, there is shown simplified illustrations of a specific embodiment according to the present teachings in which a plurality of I/O pads 104 are connected together in a scan chain. FIG. 3 illustrates a conventional driver scan chain 302 wherein the driver scan out signal 220 of a first one of the I/O pads 104a is connected to the driver scan in signal 218 of a second one of the I/O pads 104b. The driver scan chain 302 has a beginning, which is a driver scan in signal 306, and an end, which is a driver scan out signal 308. In a separate and differently configured receiver scan chain 304, and with specific reference to FIG. 4, the receiver scan out/eTDR signal 254 of the first I/O pad 104a is connected to the receiver scan in/eTDR signal 238 of the second I/O pad 104b. The receiver scan chain 304 differs from a conventional scan chain in that the receiver scan chain 304 can be configured to be circular wherein all of the data capture registers 248 are interconnected at both a receiver scan in/eTDR 238 and a receiver scan out/eTDR 254. Specifically, the receiver scan out/eTDR signal 254 for the $n^{th}$ I/O pad 104 is connected to a first input of a two to one TDR circulating mux 450 and also has an external receiver scan out 454 connection pad. A second input of the TDR circulating mux 450 is a conventional external receiver scan input signal 452. Selection control for the TDR circulating mux 450 is the TDR test signal 244. When the TDR test signal 244 is asserted, the TDR circulating mux 450 selects the receiver scan output/eTDR signal 254 of the nth I/O pad 104(n) to present at an output of the TDR circulating mux 450. The output of the TDR circulating mux 450 is an input into the receiver scan chain 304 as the receiver scan in/eTDR signal 238 of the first I/O pad 104a, thereby, completing the circular configuration of the receiver scan chain 304. When the TDR test signal 244 is not asserted, the TDR circulating mux 450 selects the external receiver scan input signal 452 to present at its output and the receiver scan chain 304 operates from external scan input signals as is conventional. When the TDR test signal 244 is asserted, the TDR circulating mux 450 selects the receiver scan out/eTDR signal 254 to present at its output and the receiver scan chain 304 operates in a re-circulating mode for the purposes of the eTDR test as disclosed herein.

The receiver scan chain 304 is configured during the test to operate as a multi-bit shift register. A beginning of the multi-bit shift register is established by a value of the TDR test select signal 242. With reference to Table 1, for the I/O pad under test, the TDR test select signal 242 controls test mux 236. For the I/O pad under test, the TDR test select signal 242 breaks the receiver scan chain 304 by selecting a receiver signal 234 to be input into the receiver data capture register 248. In effect, this establishes the I/O pad under test as the first bit in the multi-bit shift register created by the circular scan chain configuration. For the I/O pad that is not under test, but during the TDR test, the test select signal 242 causes the test mux 236 to select the receiver scan out signal 254 from the I/O pad to which it is connected to be an input, thereby creating the shift register configuration for all I/O pads not under test in the receiver scan chain 304.

The interconnected data output registers in the driver scan chain 302 are used to store data for providing a TDR stimulus signal and the connected data capture registers 248 in the receiver scan chain 304 are used to store captured test response data during the TDR test. When a TDR test is not in process, the scan chains 302, 304 operate conventionally and for conventional purposes. Also part of the I/O pad configuration, but not shown in FIG. 3 of the drawings, is a JTAG scan chain. The JTAG scan chain is conventional and is used to configure the IC for conventional JTAG testing, but is also used in an embodiment according to the present teachings.

A TDR test is performed at an operating clock frequency, $f_{clock}$ having a period of $1/f_{clock}=T_{clock}$ and uses the receiver scan chain 304 to store test data. Accordingly, in an embodiment according to the present teachings, the receiver scan chain 304 must operate at the clock frequency, $f_{clock}$. Conventionally, the scan chain operates at something less than the clock frequency. Accordingly, care is taken in an embodiment of a receiver scan chain according to the present teachings to provide I/O pad interconnections that accommodate the timing requirements of the TDR test. In a specific embodiment the driver scan chain 302 stores test stimulus data that is clocked through the scan chain at the clock frequency, $f_{clock}$. It is not necessary, however, for the driver scan chain 302 to have the circular configuration and it is configured as a conventional scan chain and used for the purpose according to the present teachings. Alternatives to the driver scan chain 302 for providing a test transition includes separate logic that does not use the driver scan chain 302; for example, edge-generation circuitry in the IEEE Std 1149.6 boundary scan register of the driver.

A brief overview of a specific embodiment of the TDR test process according to the present teachings is now presented to aid in better understanding the specific process flow. A single I/O pad 104 tests a single transmission element (herein "the transmission element under test") to which it is attached. There is one transmission element under test in a single receiver scan chain 304 at one time. In the specific embodiment where the driver scan chain 302 provides the test transition, the driver 200 that is connected to the transmission element under test is programmed to deliver a single TDR test transition a plurality of times. The data capture register 248 connected to the transmission element under test is a first data capture register in the receiver scan chain 304 for that test. Only the data capture register 248 for the I/O pad under test receives data through its receiver 226 for each launch of the TDR test transition for different clock delays and reference voltages. All data capture registers 248 in the receiver scan chain 304 for I/O pads other than the one under test receive data through the receiver scan chain 304 via the receiver scan in/TDR signal 238. The number of I/O pads 104 in the receiver scan chain 304 determines how many measurements may be taken for a single test transition launch. The number of data points that may be taken for a single test transition launch defines a maximum measurement time interval. Therefore, if there are N I/O pads 104, and therefore N data capture registers 248, in the scan chain, then data may be captured in the receiver scan chain 304 for a time interval equal to $N*T_{clock}$. The receiver scan chain 304 operates as a shift register where overflowed bits are dropped, but because it is connected in a circular configuration during the TDR test, any one of the data capture registers 248 may be defined as the beginning of the scan chain shift register. Accordingly, a time interval equal to $2NT_{clock}$ may be captured by capturing the first $NT_{clock}$ time interval for a first test transition launch, retrieving the captured data, and then in a second test transition launch, permitting the first $NT_{clock}$ worth of stored data to be shifted out, capturing a second $NT_{clock}$ interval, and then retrieving the second interval. Any integer multiple of $NT_{clock}$ may be captured with an appropriate selection and control of the number of clock pulses to perform the test. In this way, a signal received on the transmission element under test builds a time vs. amplitude graph of the reflected signal relative to the launched test transition. The present teachings make reference to a test transition. It is also possible to test the transmission element with a test pulse, which involves two test transitions. The term test transition is used in the general sense to refer to one or more test transitions, which can correspond to a test pulse or to a more complex test signal involving more than two logic transitions.

Figure 5:
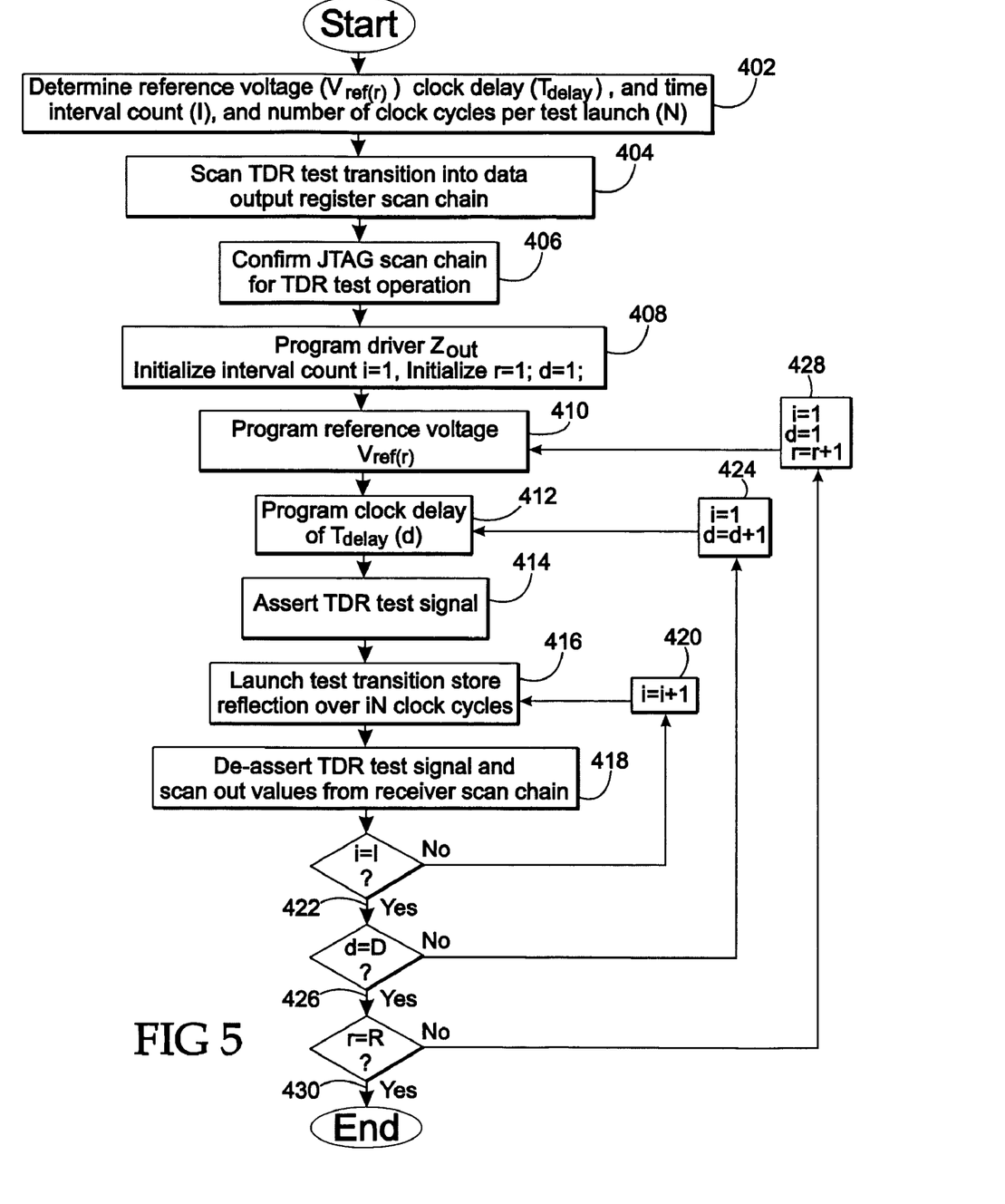
FIG. 5 is a flow chart of a process for performing a time domain reflectometry test according to the present teachings.

With specific reference to FIG. 5 of the drawings, there is shown a flow chart of a specific embodiment of the TDR test process according to the present teachings. As a preparation step, a reference voltage array $V_{ref}$, a time delay array, $T_{delay}$, and a time interval count, I, and a number of clock cycles per test, N, are established 402 for the transmission element under test. Logic values are scanned 404 into the data output registers 206 via the driver scan chain 302. The logic values scanned in are in preparation for presenting the TDR test transition at the external data output 204 of the I/O pad 104 connected to the transmission element under test. In a specific embodiment, only one I/O pad 104 performs the TDR test. In a preferred embodiment, the TDR test transition is a logic "0" to "1" single clock cycle transition. Other test transitions include a "1" to "0" single cycle transition, and a low going or high going pulse that returns to the original logic value after a single clock cycle, i.e. logic "010" or "101". As a specific example, to program a low to high TDR test transition, for a scan chain having 16 connected I/O pads 104, the binary logic pattern "0111 1111 1111 1111" is stored in the driver scan chain 302. With specific reference to Table 1, values are loaded 406 into the JTAG scan chain (not shown) to configure all I/O pads 104 in preparation for the TDR test. Values for each I/O pad 104 are loaded 410 so that all output drivers 200 in the JTAG scan chain with the exception of the output driver 200 for the transmission element under test are placed in their JTAG high impedance state. The single output driver 200 enabled status together with assertion of the TDR test signal 244 configures the driver scan chain 302 for launch of the test transition. Assertion of the TDR test signal 244 further configures the receiver scan chain 304 for capture and shift mode of operation to permit storage of received data during the TDR test. The driver output impedance, $Z_{out}$ 202, is then programmed 408 for the output driver 200 of the I/O pad 104 performing the TDR test and an interval counter variable, i, is initialized to 1. The driver output impedance 232 stays constant for the duration of the TDR test. A plurality of voltage reference values, $V_{ref}(r)$, are defined where a first voltage reference value is $V_{ref}(1)$ and a last voltage reference value of $V_{ref}(R)$. The voltage reference 232, is initialized 410 to a first voltage reference value, $V_{ref}(1)$, for the receiver 226 of the I/O pad connected to the transmission element under test. A plurality of clock delay values, $T_{clock}(d)$, are defined where a first clock delay value is $T_{delay}(1)$ and a last clock delay value is $T_{clock}(D)$. The clock delay, $T_{delay}(d)$, of the I/O pad under test is then programmed 412. The clock delay and reference voltage values may be programmed on the IC using any number of conventional methods including without limitation, JTAG protocols, conventional scan chain, or dedicated IC configuration inputs. In a specific embodiment, because the same write/read clock signal 210 controls the driver scan chain 302 as well as the receiver scan chain 304, only the write/read clock signal is necessary to clock operation of the TDR test.

To begin operation of the TDR test, the TDR test signal 244 is asserted 414. A series of clock pulses at frequency $f_{clock}$ are then generated to perform the test. The test transition is launched 416 from the output driver 200. The test starts when the clock is first asserted and continues at the clock frequency. The test transition propagates down the transmission element under test, reaches some termination and at some time after test transition launch, a reflection may return to the external connection pad 204 for the transmission element under test. Any reflection received depends upon the nature of the transmission element. At each clock cycle of the delayed clock 252, a logic value on the external connection pad 204 is stored 416 in the data capture register 248 for the I/O pad 104 connected to the transmission element under test. Previously stored values in the data capture registers 248 are shifted to next adjacent data capture registers 248 via the receiver scan chain 304. Accordingly, a data point is captured for each clock cycle for a total of N data points captured for each test transition launch. The time interval captured for each test transition launch is $NT_{clock}$ units of time. After N clock cycles, the clock is stopped and the TDR test signal 244 is de-asserted 418. With reference to Table 1, this places the receiver scan chain 304 in normal scan mode and values in the data capture registers 248 may be scanned out and stored 418 externally for later analysis. Data is scanned out of the receiver scan chain 304 through external receiver scan out 454 connection pad. There is only one such external receiver scan out 454 connection pad per receiver scan chain 304. Accordingly, the placement of the external receiver scan out 454 connection pad within the receiver scan chain 304 may be offset from a logical beginning of the data to be captured. Therefore, a relationship of the location of the external receiver scan out 454 connection pad within the receiver scan chain 304 to the I/O pad under test within the receiver scan chain 304 is maintained in the system that retrieves data from the receiver scan chain 304. After the data is captured and retrieved from the receiver scan chain 304, it is then re-aligned according to a placement in the receiver scan chain 304 of the I/O pad under test relative to the external receiver scan output 454 connection pad.

If more than 1 time interval of $NT_{clock}$ is desired for a test, the process is repeated 420 for the same voltage reference, $V_{ref}(r)$, and clock delay, $T_{delay}(d)$, for an integer multiple of N clock cycles up to i*N clock cycles. When all I time intervals are captured 422, the delay element 250 is programmed 424 with a next delay value, $T_{delay}(d+1)$ and the time interval count, i, is reset to 1. The voltage reference, $V_{ref}(r)$, is held at the same value. The same process of test transition launch 416 is repeated and reflected values at the external connection pad 204 are captured for successive delay values for I intervals each until the delay count, d, is equal to a total number of delay values, D, over the clock period 426, $T_{clock}$. The entire TDR launch and capture process for I intervals of $NT_{clock}$ is then repeated 428 for successive voltage reference values, $V_{ref}(r)$, until the reference voltage value reaches 430 its maximum value, $V_{ref}(R)$. Accordingly, the test launch and data storage process is repeated M times where:

$$M=I*R*D \quad (1)$$

to collect P data points where:

$$P=M*N \quad (2)$$

In one embodiment, the reference voltage increments are evenly distributed across the available voltage reference value range. In another embodiment, the reference voltage increments can be any set of arbitrary voltage values with an available voltage reference value range. The same holds true for the clock delay values. In one embodiment, delay increments are evenly spaced in time. In another embodiment, the delay values can be arbitrarily spaced over the clock period.

The operations of loading and unloading scan data referred to in FIG. 5 may be performed by Automated Test Equipment (ATE). Such equipment includes a data processing device such as a computer, along with appropriate components to connect to the device being tested. In one embodiment, the ATE may be a JTAG-based test system that connects to a Test Access Port (TAP) of the IC under test, as described in IEEE Std 1149.1. In an alternative embodiment, the ATE may be a portion of the IC architecture itself, using system connections to provide data access.

Figure 6:
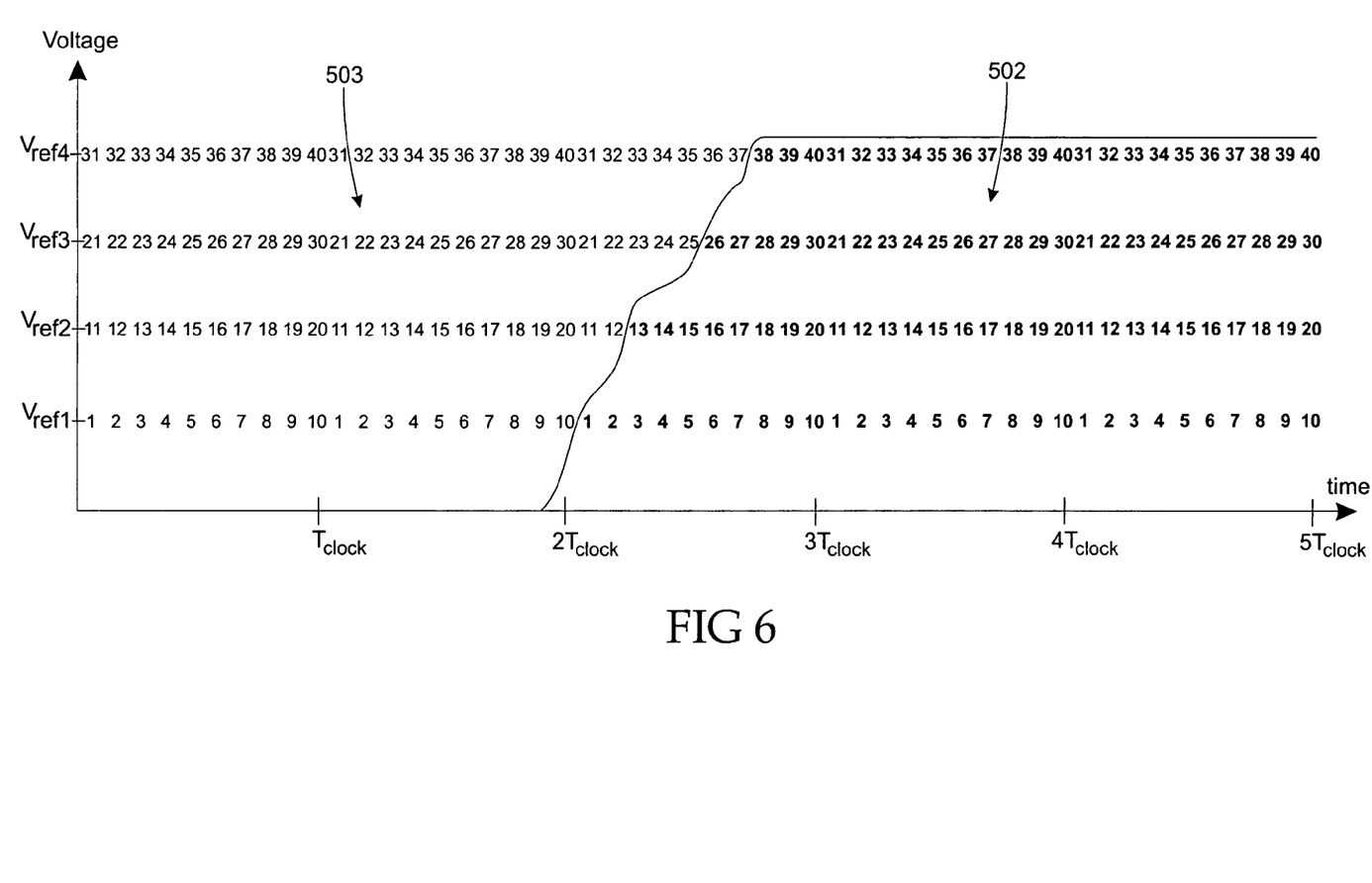
FIG. 6 is a graphical representation of data returned as a result of a test according to the present teachings.

With specific reference to FIG. 6 of the drawings, there is shown a graph of data points captured in a process according to the present teachings in which an x-axis represents time where t=0 is a launch of the test transition and a y-axis is voltage reference value. An external processing device, such as a computer, receives and assembles the captured data points into a graph or other analysis device. For purposes of illustration, and with respect to equation (1), the numbers 1 through 40 represent data points captured for respective passes of test transition launch/data capture for an illustrative TDR test process where M=(1)(4)(10)=40. Also in the illustrative example, I=1 wherein only a single time interval of $NT_{clock}$ is captured, and N=5 where five clock cycles comprise the time interval. Accordingly, 200 data points are captured for the example test in FIG. 6 of the drawings. Numbered data points shown in the graph in a bold font 502 represent logic "1"s captured in the data capture registers and data points shown in the graph in a regular font 503 represent captured logic "0"s. In a specific test as illustrated by the graph, the clock delay is programmed in intervals of $T_{clock}/10$, the voltage reference is programmed in four evenly spaced intervals over the available reference voltage range, and N=5 meaning that there are five I/O pads 104 in the receiver scan chain 304. As one of ordinary skill in the art appreciates, there are typically many more I/O pads in the receiver scan chain 304. The smaller number of I/O pads in the receiver scan chain is used herein for illustrative clarity. The principles of operation, however, scale without modification of the basic process.

Prior to a first test transition launch, the programmable delay is set to $T_{delay}(1)=T_{clock}/10$ and the programmable voltage reference is set to $V_{ref}(1)$. Accordingly, a logic value present at the external connection pad relative to the programmable voltage reference is clocked into the data capture register at transitions of the write/read clock 210 plus a delay 250 of $T_{clock}/10$. After five transitions of the write/read clock 210, the receiver scan chain 304 is full and values stored in the receiver scan chain 304 are scanned out. These five scanned values in the example are represented as data points 1 on the graph of FIG. 6. With the same voltage reference value, $V_{ref}(1)$, the programmable delay 250 is set to $T_{delay}(2)= 2T_{clock}/10$ or $T_{clock}/5$. A second test transition is launched and five more values are captured in the receiver scan chain 304 and then scanned out of the receiver scan chain 304. The five new scanned out values are represented as data points 2 on the graph of FIG. 6. Eight more test transitions are launched using the same programmable voltage reference, $V_{ref}(1)$, to capture and scan out of the receiver scan chain 304, eight more sets of five data points represented in FIG. 6 as data points 3 through 10. Note that in the present illustration, the tenth delay interval causes the data capture register to clock in a value that is a full period of the write/read clock 210 later than the transition that clocks the test transition out onto the external connection pad 204. In the specific example, when d=D, a new voltage reference value, $V_{ref}(2)$ is programmed. The programmable delay, $T_{delay}$, is reset to its initial value of $T_{clock}/10$ and ten more test transitions are launched, with data capture performed for each test transition launched, and scan out of the receiver chain 304. Data captured for the new voltage reference value is represented in FIG. 6 as data points 11 through 20. Similarly, data is captured for voltage reference values of $V_{ref}(3)$ and $V_{ref}(4)$ to obtain logic values to build the complete graph of FIG. 6 that represents 40 test transition launches and data capture. Bolded data points represented in the graph of FIG. 6 shows those captured data points having a logic value of "1". Data points shown in a regular font represented in the graph in FIG. 6 shows those captured data points having a logic value of "0". Because it is known that the test transition is clocked out at the transition of t=0, the amplitude and time relationships of the captured data values in FIG. 6 show characteristics of a reflected test transition and conclusions can be drawn as to a nature of impedances on the transmission element under test and electrical distance of discontinuities from the external connection pad 204.

Figure 7:
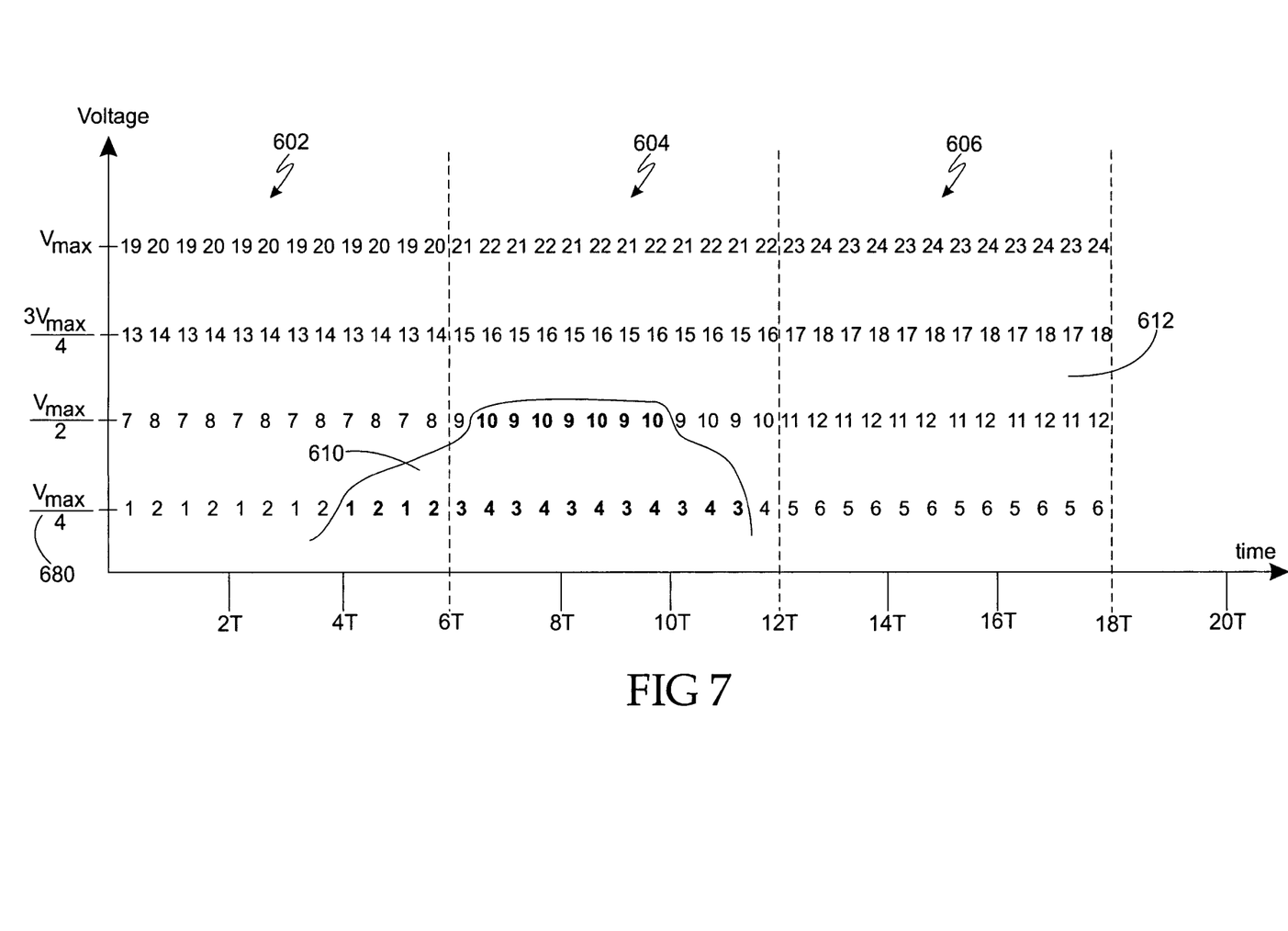
FIG. 7 is a graphical representation of data returned as a result of a different test according to the present teachings.

With specific reference to FIG. 7 of the drawings, there is shown another graph in a different embodiment of a test process according to the present teachings to illustrate a process to obtain longer time intervals than permitted by a single receiver scan chain. For purposes of illustrative clarity, the example shown is not a practical example, but illustrates a feature that may be easily scaled by one of ordinary skill in the art with benefit of the present teachings. FIG. 7 of the drawings, shows a graph illustrating first 602, second 604 and third 605 $NT_{clock}$ time intervals, where N=6, meaning that 6 data points are captured in the receiver scan chain 304 for each test transition launch. Programming a clock delay of $T_{clock}/2$ provides for illustrative simplification. There are four different voltage reference values. The present illustration shows how to accumulate additional time data than is available over a single $NT_{clock}$ time interval, a total of three $NT_{clock}$ time intervals are captured.

First and second launches of the test transition at the first voltage reference value 608 capture data points represented with the numerals "1" and "2" respectively on the graph of FIG. 7. If N=6, there are six data capture registers 248 in the receiver scan chain 304 for a first capture interval of $6T_{clock}$. Accordingly, N cycles of the write/read clock 210 occur before de-assertion of the TDR test signal 244 and scanning out of the data stored in the receiver scan chain 304. To capture data for the second capture interval 604, 2N cycles of the write/read clock 210 occur before de-assertion of the TDR test signal 244. Data captured in the first time interval 602 is shifted out during the second time interval 604 to permit storage of the new data from the second time interval 604. Accordingly, data represented by the numerals "3" and "4" are those values scanned out after 2N clock cycles for the third and fourth launch of the test transition. Similarly, 3N cycles of the write/read clock 210 occur before de-assertion of the TDR test signal 244 to capture data for the 5$^{th}$ and 6$^{th}$ test transition launches shown in the third time interval 606. A region represented in the graph of FIG. 7 showing data points in a bold font 610 represents those data points that reflect a "1" logic value and a region represented in the graph of FIG. 7 showing data points in a regular font 612 represents those data points that reflect a "0" logic value.

Embodiments of an apparatus and test process according to the present teachings are herein disclosed for purposes of illustration and are not meant to limit that which is claimed. Many alternatives not specifically illustrated will occur to one of ordinary skill in the art with benefit of the present teachings. Those many alternatives remain within the scope of the appended claims. Specifically, there is shown a process and apparatus wherein an IC is embedded with circuits that approximate a time domain reflectometry test for the purpose of testing transmission elements connected to the IC, but are not part of the IC itself. The present teachings explain by way of example how one of ordinary skill in the art can scale the present IC and test process to perform any number of different tests having programmable clock delay values, voltage reference values, time intervals and therefore, test length, as well as scan chain lengths. It is also taught that a test stimulus can be a high going or low going logic transition or a high going or low going test pulse. It may also occur to one of ordinary skill in the art that a test can be fashioned with a more complex test signal profile involving a combination of one or more test pulses and transitions. Also, as a practical matter, there are typically many more I/O pads that comprise the receiver scan chain 304, and there are often more voltage reference value and clock delay values for improved resolution than that illustrated herein. Furthermore, additional storage elements may be added to the receiver scan chain solely for the purpose of increasing its length to allow the capture of additional samples, either to extend the duration of the test at a given frequency or to sustain a given number of sample points at a higher frequency. Additionally, alternative data storage devices that receive the TDR scan out signal 254, such as one or more shift registers or on-chip random access memory, may be used to store sample data at the I/O pad 104 instead of relying on the receiver scan chain 304 for data storage. Use of this alternative local storage enables testing of multiple transmission elements in parallel. The local storage alternative, however, calls for additional circuit area on the IC. Additionally, increased timing resolution may be achieved by implementing the local storage elements at an output of the test mux 246 in addition to the data capture register 248 and clocking the local storage elements with a secondary clock that operates at a different and higher frequency. Preferably, but not necessarily, the higher frequency of the secondary clock is an integer multiple of the write/read clock frequency and is synchronized with the write/read clock frequency. The resulting data may be used as a fine-grained timing vernier and when combined with the coarser-grained timing intervals defined by the scan chain shift frequency ($f_{clock}$) creates a composite timing diagram. It is described herein that the driver scan chain 302 provides the test transition. Alternatively, a separate circuit can provide the test transition without employing the driver scan chain 302, such as the edge-generation circuitry in the driver boundary scan register described in IEEE Std 1149.6. Circuitry that supports the driver boundary scan register for test transition signal generation is illustrated in FIG. 2 of the drawings. Other embodiment and variations will occur to one of ordinary skill in the art with benefit of the present teachings.

The invention claimed is:

1. An apparatus comprising:
an integrated circuit ("IC") having one or more input/output ("I/O") pads, each said I/O pad comprising
a data output driver having an output impedance, and configured to launch onto a transmission element connected to the I/O pad a test signal having a signal level transition;

a data output register configured to receive the test signal having the signal level transition and to provide the test signal to the data output driver in response to a clock signal;

a programmable reference generator configured to provide a programmed reference voltage;

a receiver configured to receive from the transmission element a reflection of the test signal having the signal level transition and to compare the received reflection to the programmed reference voltage and in response thereto to output a received reflection signal, a programmable delay element configured to receive said clock signal and to output a delayed clock signal;

data capture select logic for selecting between the received reflection signal and a scan input signal received from another one of the I/O pads of the IC, and outputting a multiplexed output signal; and a data capture register configured to receive the multiplexed output signal and to output a scan output signal in response to the delayed clock signal.

2. An apparatus as recited in claim 1 wherein there are at least two I/O pads and said data capture registers of said at least two I/O pads are interconnected to function as a shift register.

3. An apparatus as recited in claim 2 and further comprising additional data capture elements interconnected to said data capture registers to function as additional bits for said shift register.

4. An apparatus as recited in claim 1 wherein said data capture register provides the scan output signal to a multiple bit local storage element in response to a secondary clock signal that operates at a higher frequency than said clock signal.

5. An apparatus as recited in claim 1 and further comprising a multiple bit local storage element.

6. An apparatus as recited in claim 1 wherein there are at least two I/O pads and said data output registers of said at least two I/O pads are interconnected to function as a shift register.

7. An apparatus as recited in claim 6 wherein said data output registers are scannable and are stored with data that provides at least one test transition at said I/O pad.

8. An apparatus as recited in claim 1 having N I/O pads, each I/O pad accepting a scan input signal from another I/O pad and producing a scan output signal, wherein respective I/O pads are successively connected in a receiver scan chain wherein said scan output signal from one of said I/O pads is presented as said scan input signal in another one of said I/O pads and wherein said scan output signal of an $N^{th}$ I/O pad is presented as said scan input signal of a first I/O pad to achieve a circular receiver scan chain configuration.

9. An apparatus as recited in claim 8 wherein said scan output signal of said Nth I/O pad is presented as said scan input signal of said first I/O pad only when a time domain reflectometry (TDR) test signal is asserted.

10. An apparatus as recited in claim 9 wherein said scan output signal of said Nth I/O pad is presented as said scan input signal of said first I/O pad through a circulating mux when said TOR test signal is asserted.

11. An apparatus as recited in claim 10 wherein an external scan input signal is presented to said first I/O pad when said TDR test signal is not asserted.

12. A method of testing a transmission element connected to an integrated circuit (IC), the method comprising:

in response to a clock signal, launching a test signal having a signal level transition from an I/O pad of the IC onto said transmission element;

capturing data at said I/O pad indicating an amplitude status of a reflection of said test signal relative to a reference voltage in response to a delayed clock signal produced by applying a programmed delay to the clock signal; and repeating the steps of launching and capturing for at least two different values of said reference voltages.

13. A method as recited in claim 12 wherein each said I/O pad comprises a data output driver having an output impedance, and configured to launch the test signal onto the transmission element;

a data output register configured to receive the test signal having the signal level transition and to provide the test signal to the data output driver in response to a clock signal, a programmable reference generator configured to provide the reference voltage having the at least two different values for repeating the launching and capturing steps;

a receiver configured to receive from the transmission element the reflection of the test signal and to compare the received reflection to the reference voltage and in response thereto to output a received reflection signal, a programmable delay element configured to receive said clock signal and to output the delayed clock signal;

data capture select logic for selecting between the received reflection signal and a scan input signal received from another one of the I/O pads of the IC and outputting a multiplexed output signal; and a data capture register configured to receive the multiplexed output signal and to output a scan output signal in response to the delayed clock signal.

14. A method as recited in claim 13 and further comprising the step of interconnecting said data capture registers to function as a shift register.

15. A method as recited in claim 13 where said IC has N I/O pads, each I/O pad accepting a scan input signal and producing a scan output signal wherein respective I/O pads are successively connected in a receiver scan chain wherein said scan output signal from one of said I/O pads is presented as said scan input signal in another one of said I/O pads and wherein said scan output signal of an $N^{th}$ I/O pad is presented as said scan input signal of a first I/O pad to achieve a circular receiver scan chain configuration.

16. A method as recited in claim 15 wherein said scan output signal of said $N^{th}$ I/O pad is presented as said scan input signal of said first I/O pad only when a time domain reflectometry (TDR) test signal is asserted.

17. A method as recited in claim 16 wherein said scan output signal of said $N^{th}$ I/O pad is presented as said scan input signal of said first I/O pad through a circulating mux when said TDR test signal is asserted.

18. A method as recited in claim 16 wherein an external scan input signal is presented to said first I/O pad when said TDR test signal is not asserted.

19. A method as recited in claim 12 and further comprising repeating the steps of launching and capturing for a plurality of values for said programmed delay and a plurality of values for said voltage reference to assemble a relationship of voltage versus time for said reflection.

20. A method as recited in claim 19 and further comprising the step of determining transmission characteristics of said transmission element from said relationship of voltage versus time for said reflection.

21. A method as recited in claim 12 wherein said step of launching said test signal comprises the step of sourcing said test signal from a boundary scan function associated with a driver connected to said transmission element, and wherein the boundary scan function operates with a boundary scan clock that is different from, and asynchronous with, said clock signal.

22. A method as recited in claim 12 wherein said transmission element is connected to a driver of said I/O pad and said step of launching said test signal comprises
   interconnecting driver output registers of a plurality of said I/O pads, said driver output registers operating with said clock signal,
   storing logic values into said driver output registers and presenting said logic values to said driver of said I/O pad over successive edges of said clock signal.

23. A method as recited in claim 12 wherein said step of capturing further comprises storing data in a multiple bit local storage element associated with said I/O pad wherein the data is stored in response to a secondary clock signal having a higher frequency than said clock signal.

* * * * *